United States Patent
Wang et al.

(10) Patent No.: US 10,276,718 B2
(45) Date of Patent: Apr. 30, 2019

(54) FINFET HAVING A RELAXATION PREVENTION ANCHOR

(71) Applicant: Taiwan Semiconductor Manufacturing Co., Ltd., Hsinchu (TW)

(72) Inventors: Sheng-Hsiung Wang, Hsinchu County (TW); Yung Feng Chang, Hsinchu (TW); Tung-Heng Hsieh, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/692,721

(22) Filed: Aug. 31, 2017

(65) Prior Publication Data
US 2019/0067479 A1    Feb. 28, 2019

(51) Int. Cl.
| | |
|---|---|
| *H01L 29/66* | (2006.01) |
| *H01L 29/78* | (2006.01) |
| *H01L 29/41* | (2006.01) |
| *H01L 27/08* | (2006.01) |
| *H01L 27/12* | (2006.01) |
| *H01L 21/82* | (2006.01) |
| *H01L 21/84* | (2006.01) |
| *H01L 21/8238* | (2006.01) |
| *H01L 27/092* | (2006.01) |

(52) U.S. Cl.
CPC .. *H01L 29/7848* (2013.01); *H01L 21/823807* (2013.01); *H01L 21/823814* (2013.01); *H01L 21/823821* (2013.01); *H01L 27/0924* (2013.01)

(58) Field of Classification Search
CPC ............. H01L 29/7848; H01L 29/785; H01L 29/66795; H01L 29/41791; H01L 27/0924; H01L 27/1211; H01L 27/0886; H01L 21/845; H01L 21/823431; H01L 2029/7858
See application file for complete search history.

(56) References Cited

U.S. PATENT DOCUMENTS

| | | | | |
|---|---|---|---|---|
| 6,764,884 B1* | 7/2004 | Yu | ................... | H01L 29/42392 257/E21.444 |
| 6,787,406 B1* | 9/2004 | Hill | .................. | H01L 21/26586 257/E21.345 |
| 6,894,326 B2* | 5/2005 | Nowak | ............ | H01L 29/66795 257/192 |

(Continued)

FOREIGN PATENT DOCUMENTS

| | | |
|---|---|---|
| KR | 20160051512 | 5/2016 |
| TW | 201626573 | 7/2016 |

*Primary Examiner* — Ida M Soward
(74) *Attorney, Agent, or Firm* — Haynes and Boone, LLP

(57) ABSTRACT

A method and structure for mitigating strain loss (e.g., in a FinFET channel) includes providing a semiconductor device having a substrate having a substrate fin portion, an active fin region formed over a first part of the substrate fin portion, a pickup region formed over a second part of the substrate fin portion, and an anchor formed over a third part of the substrate fin portion. In some embodiments, the substrate fin portion includes a first material, and the active fin region includes a second material different than the first material. In various examples, the anchor is disposed between and adjacent to each of the active fin region and the pickup region.

20 Claims, 7 Drawing Sheets

(56) References Cited

U.S. PATENT DOCUMENTS

| | | | |
|---|---|---|---|
| 6,969,659 B1 * | 11/2005 | Anderson | H01L 29/66545 257/346 |
| 7,282,766 B2 * | 10/2007 | Okuno | H01L 29/41791 257/347 |
| 7,323,389 B2 * | 1/2008 | Goktepeli | H01L 29/66795 257/E21.014 |
| 7,605,039 B2 * | 10/2009 | Cho | H01L 29/66818 257/E21.014 |
| 7,919,816 B2 * | 4/2011 | Gossner | H01L 27/0288 257/355 |
| 7,960,734 B2 * | 6/2011 | Lenoble | H01L 29/7851 257/231 |
| 8,039,843 B2 * | 10/2011 | Inaba | H01L 21/823807 257/327 |
| 8,796,666 B1 | 8/2014 | Huang et al. | |
| 8,815,712 B2 | 8/2014 | Wan et al. | |
| 8,823,060 B1 | 9/2014 | Colinge et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 8,963,258 B2 | 2/2015 | Yu et al. | |
| 9,006,077 B2 | 4/2015 | Akarvardar et al. | |
| 9,029,958 B2 * | 5/2015 | Ho | H01L 29/785 257/401 |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,431,539 B2 | 8/2016 | Qi et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,716,149 B2 | 7/2017 | Then et al. | |
| 9,721,955 B2 * | 8/2017 | Ching | H01L 27/1104 |
| 9,882,050 B1 * | 1/2018 | Cheng | H01L 29/7843 |
| 9,947,585 B2 * | 4/2018 | Nidhi | H01L 21/823412 |
| 2007/0132039 A1 * | 6/2007 | Doris | H01L 29/41733 257/401 |
| 2014/0239394 A1 * | 8/2014 | Cheng | H01L 29/66795 257/347 |
| 2016/0126343 A1 | 5/2016 | Ching et al. | |
| 2017/0033046 A1 * | 2/2017 | Russ | H01L 23/5256 |
| 2018/0005892 A1 * | 1/2018 | Cheng | H01L 29/1054 |

* cited by examiner

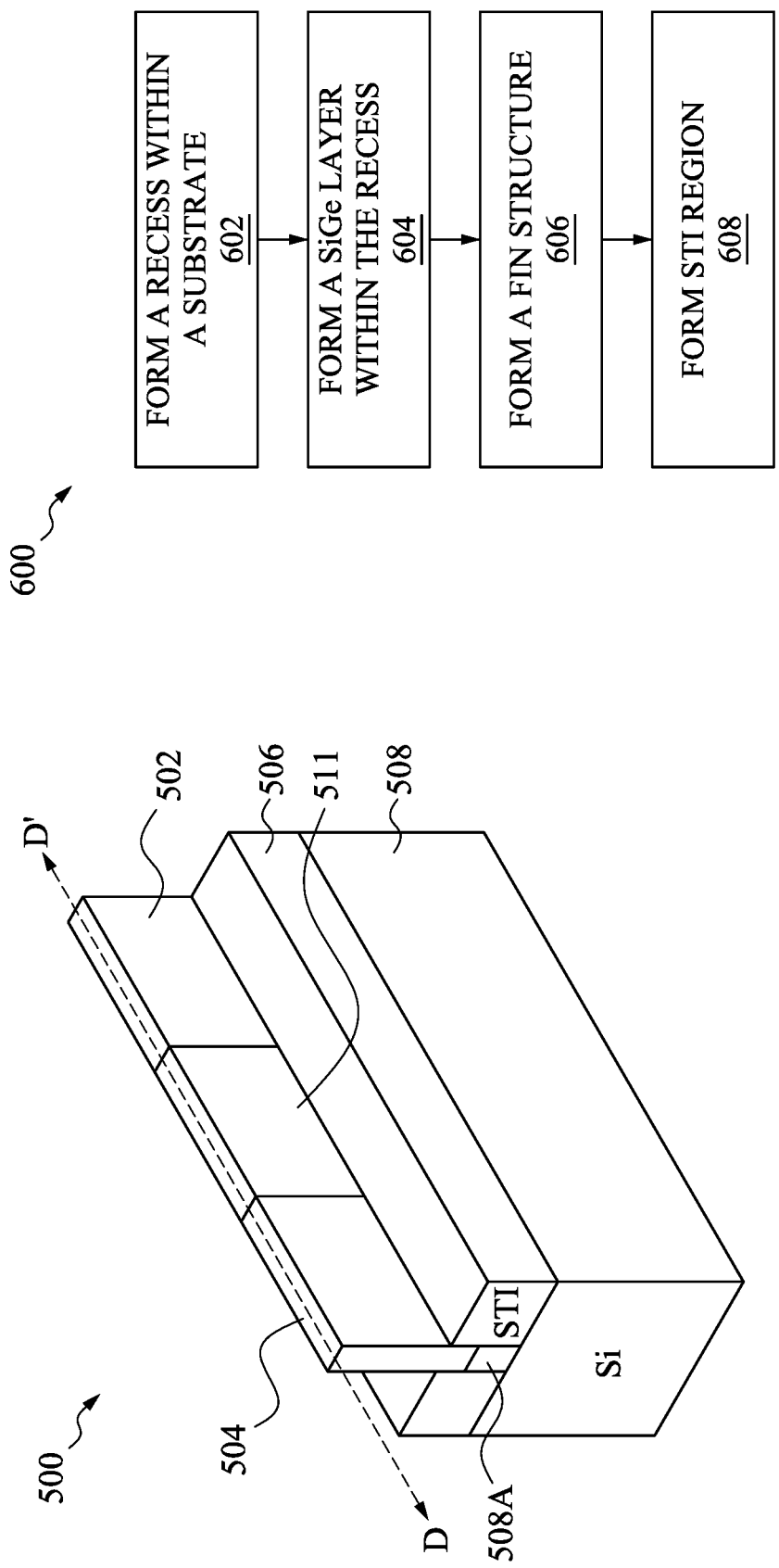

FINFET HAVING A RELAXATION PREVENTION ANCHOR

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, FinFET devices with a strained channel are being researched as a way to enhance carrier mobility (e.g., electron or hole mobility) and enhance transistor performance. However, for devices employing a strained channel, one of the most challenging aspects of transistor fabrication has been to maintain channel strain throughout the fabrication process. Strain relaxation, for example in a transistor channel, can lead to lower carrier mobility and degradation of device performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates an isometric view of a FinFET device including an anchor, according to some embodiments, where the section DD' corresponds to the section DD' of FIG. 4;

FIG. 6 is a flow chart of a method of fabricating a FinFET device according to one or more aspects of the present disclosure.

DETAILED DESCRIPTION

Figure 1:
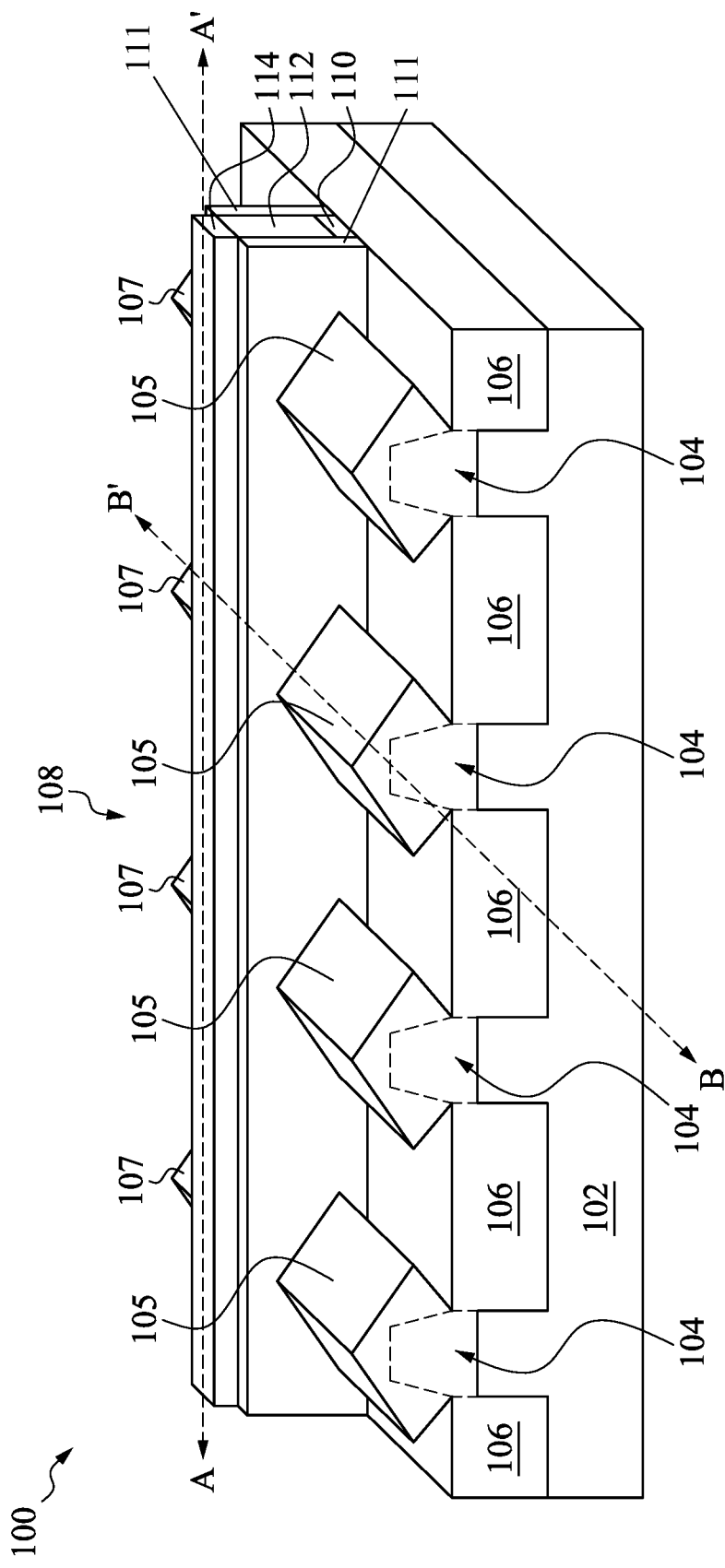
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. In some embodiments, one or more layers of a low Schottky barrier height (SBH) material are formed over the source/drain regions 105, 107 to reduce a source/drain contact resistance. In some examples, the low SBH material includes a III-V material such as GaAs, $In_xGa_{1-x}As$, Ni—InAs, and/or other suitable materials. A channel region of a transistor is disposed within the fin 104, underlying the gate structure 108, along a plane substantially parallel to a plane defined by section BB' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2/V$-s and a hole mobility of around 480 $cm^2/V$-s. In some embodiments, the channel region includes a strained channel material. By way of example, the strained channel material may be formed by using a different material for each of the fin-element 104 and the substrate 102 such that there is a lattice mismatch between the fin-element 104 and the substrate 102. The lattice mismatch between the fin-element 104 and the substrate 102 may thus create strain (e.g., tensile or compressive) within the channel region. In various embodiments, such a strained channel material provides for increased carrier mobility (e.g., electron or hole mobility) and enhanced transistor performance. As such, in some embodiments, the high-mobility material discussed above may in some cases include a strained channel material.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, $HfZrO$, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers 111 are formed on sidewalls of the gate structure 108. The sidewall spacers 111 may include a dielectric material such as silicon oxide, silicon nitride, silicon carbide, silicon oxynitride, or combinations thereof.

The use of high-mobility materials, including strained channel materials, has gained considerable interest due at least in part to the high electron and/or hole mobility that is achievable in such materials as compared to silicon. Advantages of using materials with high mobility include higher device drive current, reduced intrinsic delay, improved high-frequency performance (e.g., for radio-frequency applications), as well as other benefits. Additionally, devices employing strained channel materials provide an attractive option for performance enhancement, in particular for aggressively scaled devices. However, for devices employing a strained channel, one of the most challenging aspects of transistor fabrication has been to maintain channel strain throughout the fabrication process. Strain relaxation, for example in a transistor channel, can lead to lower carrier mobility and degradation of device performance.

By way of example, certain aspects of FinFET design can lead to strain relaxation in a FinFET channel. Consider, for example, the design of a conventional standard cell. In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (e.g., such as a NAND gate). Cell-based methodology—the general class to which standard cells belong—makes it possible for one designer to focus on the high-level (logical function) aspect of digital design, while another designer focuses on the implementation (physical) aspect. Along with semiconductor manufacturing advances, standard cell methodology has helped designers scale ASICs from comparatively simple single-function ICs (of several thousand gates), to complex multi-million gate system-on-a-chip (SoC) devices. In various examples, a standard cell (e.g., which may be referred to as a functional cell and/or functional logic cell) may include a group of transistors and interconnect structures that may provide a Boolean logic function (e.g., AND, OR, XOR, XNOR, inverters) or a storage function (flip-flop or latch). The simplest cells are direct representations of the elemental NAND, NOR, and XOR Boolean function, although cells of much greater complexity are commonly used (e.g., such as a 2-bit full-adder, or muxed D-input flip-flop).

Figure 2:
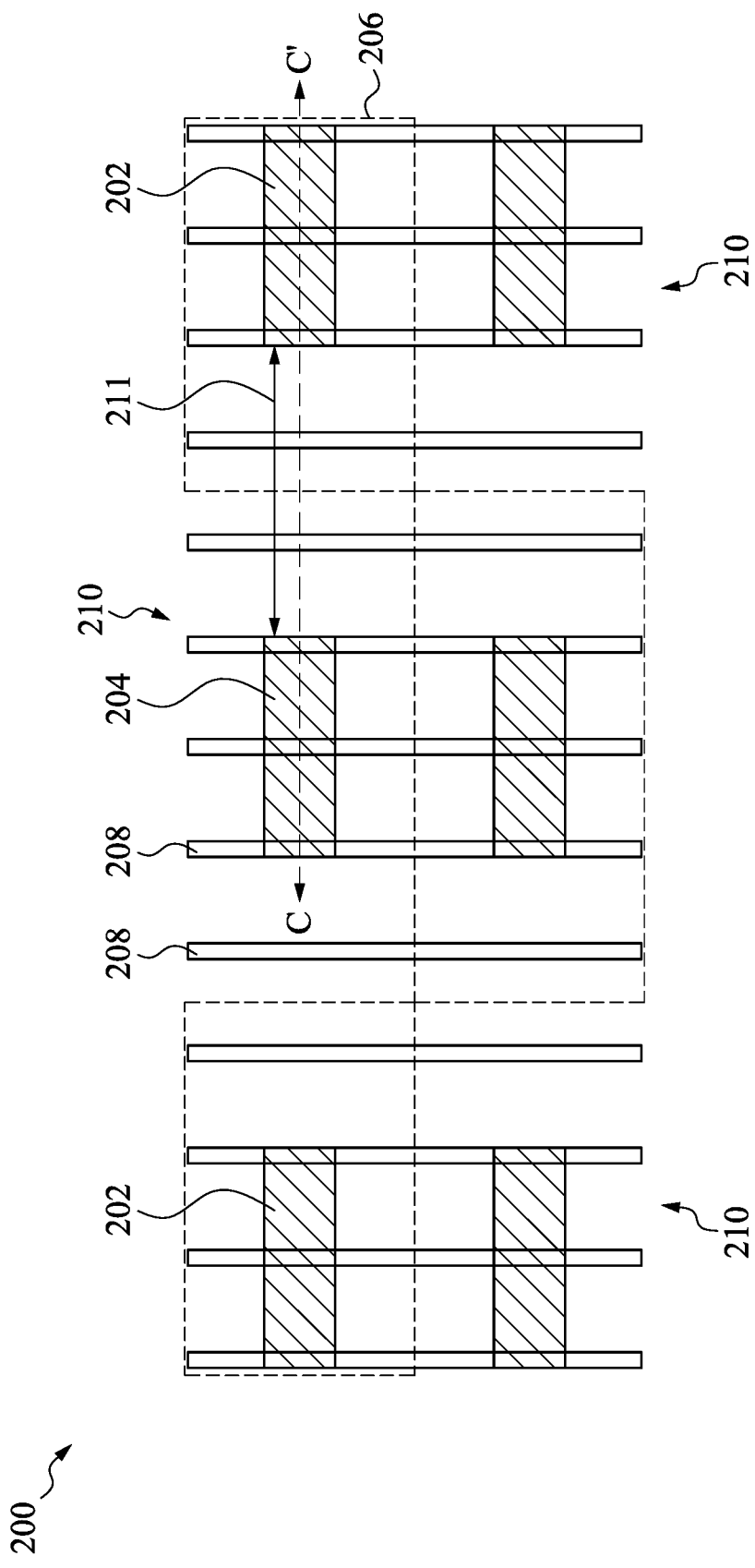
FIG. 2 illustrates a layout design of at least a portion of a FinFET standard cell.

Elaborating on the standard cell example, reference is now made to FIG. 2 which illustrates a layout design 200 of at least a portion of a FinFET standard cell. As shown, the layout design 200 includes a plurality of active fin regions 202 and a pickup region 204 disposed between the active fin regions 202. In some cases, the term "active fin region", as used herein, may be used to indicate a fin region including a FinFET channel. A dashed line 206 is used to indicate a P-type active region. Thus, in some embodiments, the plurality of active fin regions 202 may include P-type active fin regions. In some embodiments, regions outside the dashed line 206, such as regions 210, may include N-type active regions. Polysilicon features 208 are also illustrated. To be sure, the embodiments disclosed herein are not meant to be limited to any particular doping configuration, and the examples provided herein are merely provided for purposes of illustration. For example, in some cases, the dashed line 206 may alternatively be used to indicate an N-type active region, and the regions outside the dashed line 206 (e.g., regions 210) may include P-type active regions. In various examples, the pickup region 204 may include a highly doped region that may be the same conductivity type as the underlying substrate. In general, the pickup region may provide a low resistance contact to the underlying substrate. In one example, if the substrate is doped N-type, the pickup region may be highly doped N-type. Alternatively, if the substrate is doped P-type, the pickup region may be highly doped P-type. In the example of FIG. 2, if the region 210 is an N-type active region, then the pickup region 204 may include an N-type pickup region.

Figure 3:
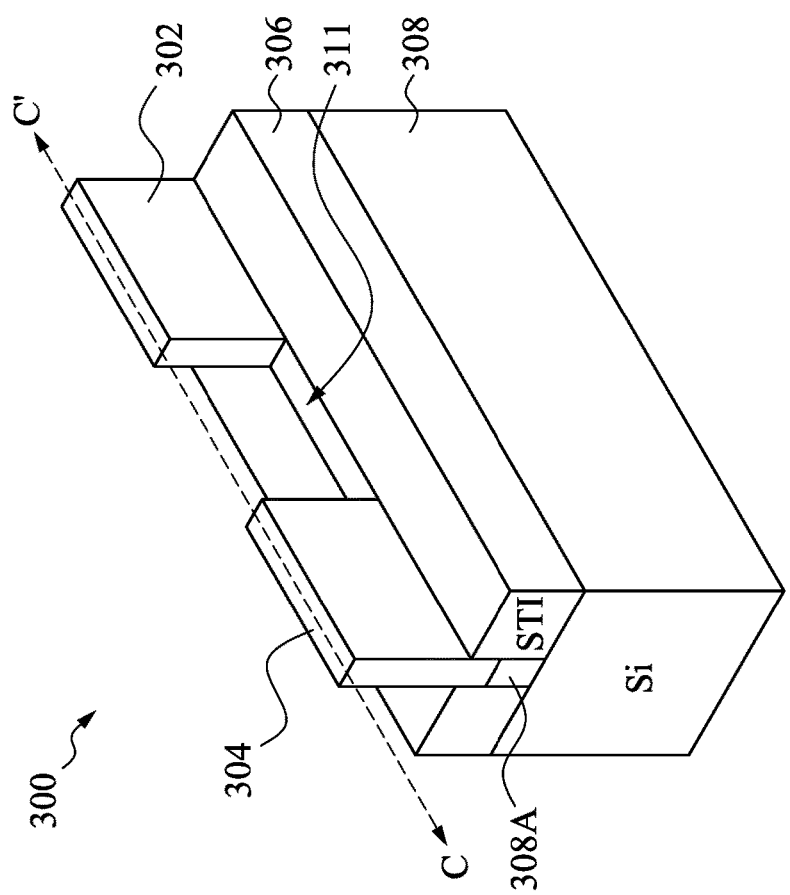
FIG. 3 illustrates an isometric view of a FinFET device, where the section CC' corresponds to the section CC' of FIG. 2.

Referring to FIG. 3, illustrated therein is an isometric view of a FinFET device 300, where the section CC' of FIG. 3 substantially corresponds to the section CC' of FIG. 2. As shown, the FinFET device 300 includes an active fin region 302 (e.g., similar to the plurality of active fin regions 202), a pickup region 304 (e.g., similar to the pickup region 204), a shallow trench isolation (STI) region 306, and a substrate 308. In some examples, the substrate 308 may include a substrate fin portion 308A extending from the substrate 308. In some embodiments, the active fin region 302 and the pickup region 304 may include epitaxial layers formed over the substrate fin portion 308A, where such epitaxial layers have been deposited, patterned, and etched to form the active fin region 302 and the pickup region 304. In various embodiments, the active fin region 302 may include a P-type active region or an N-type active region, and the pickup region 304 may include a P-type pickup region or an N-type pickup region. For purposes of discussion, consider that the active fin region 302 includes a P-type active fin region, and the pickup region 304 includes an N-type pickup region. Additionally, consider that the active fin region 302 includes a strained channel material which may be used to form a strained FinFET channel. For example, in some cases, the active fin region 302 and the substrate 308 (and substrate fin portion 3008A) may be formed by using different materials such that there is a lattice mismatch that creates strain within the active fin region 302 (e.g., the channel region of a FinFET). By way of example, the active fin region 302 may be formed of an epitaxial silicon germanium (SiGe) layer, and the substrate 308 (and substrate fin portion 308A) may be formed of silicon (Si), thus the active fin region 302 may include a strained SiGe layer. In at least some current designs, there is a gap 311 (e.g., similar to gap 211 in FIG. 2) between the active fin region 302 and the pickup region 304, along the plane defined by the section CC'. In some aspects, the gap 311 represents a discontinuity in the active region (e.g., active fin region 302 and active region defined by the pickup region 304). While the gap 311 may be used to alternate (e.g., jog) between an active fin region (e.g., the active fin region 302) and a pickup region (e.g., the pickup region 304), the gap 311 introduces a discontinuity in these adjacent epitaxial layers (e.g., the active fin region 302 and the pickup region 304) that can lead to strain relaxation in the strained SiGe layer (e.g., the active fin region 302). Thus, strain in the transistor channel is relaxed, which can lead to lower carrier mobility and degradation of device performance.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for mitigating strain loss (e.g., in a FinFET channel), so as to prevent mobility reduction and degradation of device performance. In some embodiments, an anchor may be formed between an active fin region and a pickup region. In various embodiments, the anchor may be used to mitigate strain relaxation in the active fin region by physically connecting or contacting the active fin region and the pickup region and thus avoiding a gap and/or discontinuity between these adjacent epitaxial layers. In some cases, the anchor may include a silicon (Si) anchor. In some embodiments, the anchor may be defined, for example within a layout design, as a dummy active region. By way of example, a "dummy" structure as used herein, such as a dummy active region, is to be understood as referring to a structure which is utilized to mimic a physical property of another structure (e.g., such as to mimic the physical dimensions of adjacent active regions such as the active fin region or the pickup region), and which is circuit inoperable (i.e., which is not part of a circuit current flow path) in the final fabricated device. While not necessarily part of a circuit current flow path, formation of the anchor adjacent to and in contact with the active fin region, which may include a strained material layer, serves to mitigate strain relaxation within the active fin region. By way of example, in some embodiments, the anchor may include a Si anchor formed adjacent to the active fin region, where the active fin region includes a strained SiGe layer. Thus, embodiments of the present disclosure provide for the preservation of enhanced mobility and device performance afforded by the strained channel material within the active fin region. Those skilled in the art will recognize other benefits and advantages of the methods and structures as described herein, and the embodiments described are not meant to be limiting beyond what is specifically recited in the claims that follow.

Figure 4:
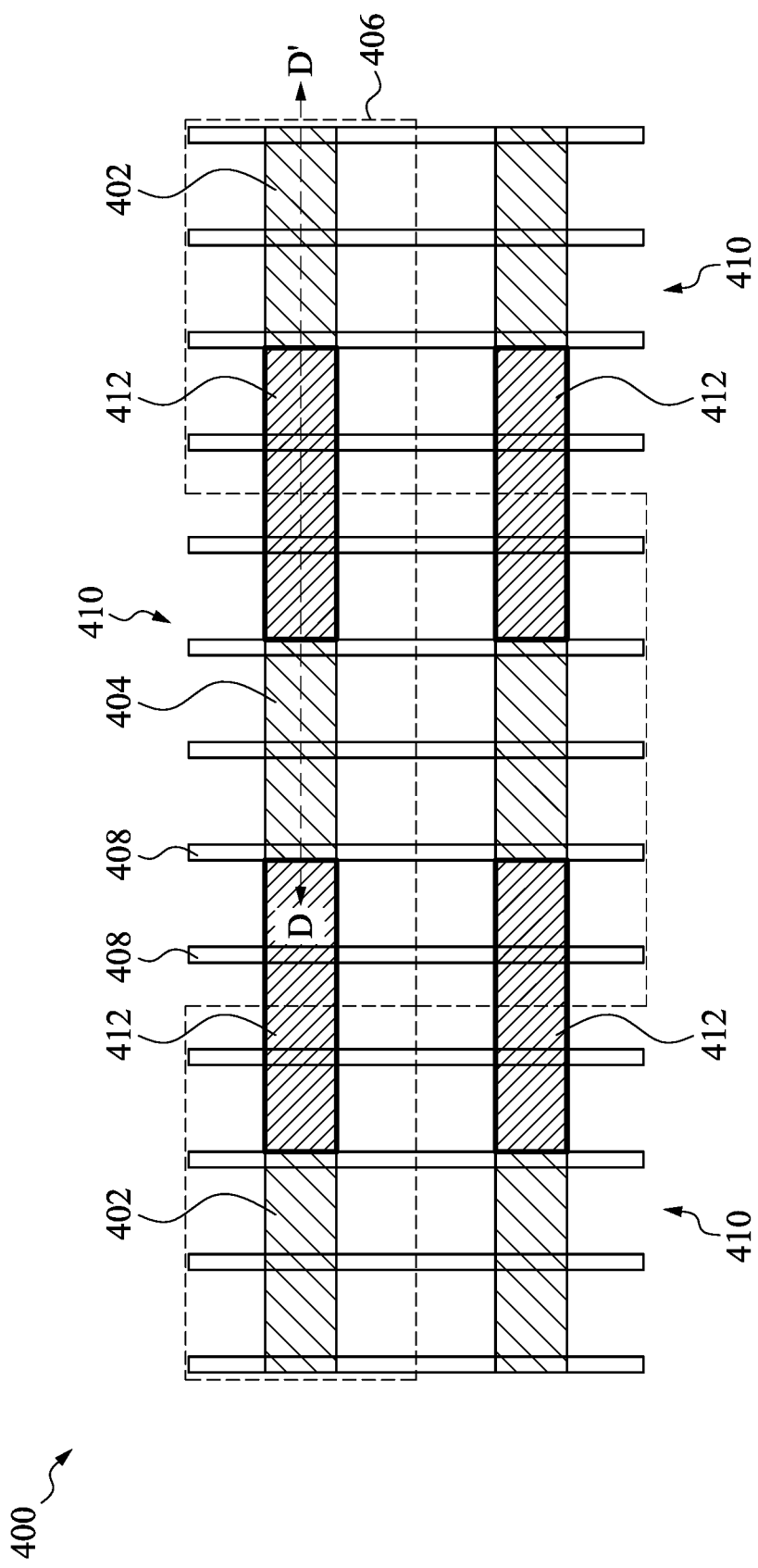
FIG. 4 illustrates a layout design of at least a portion of a FinFET standard cell including an anchor, in accordance with some embodiments.
Figure 8:
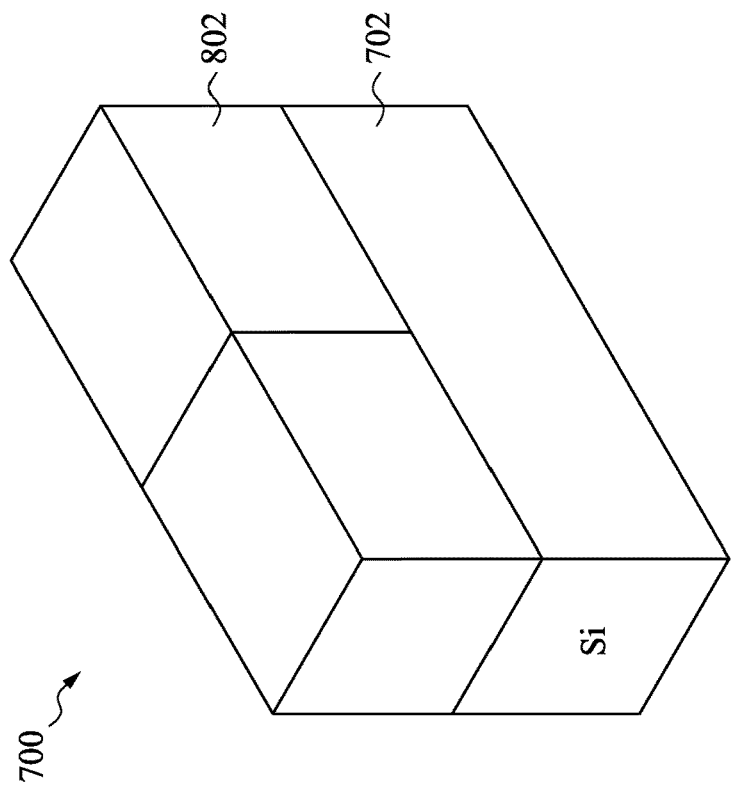
FIGS. 7, 8, 9, and 10 illustrate isometric views of an embodiment of a FinFET device corresponding to one or more steps of the method of FIG. 6.
Figure 7:
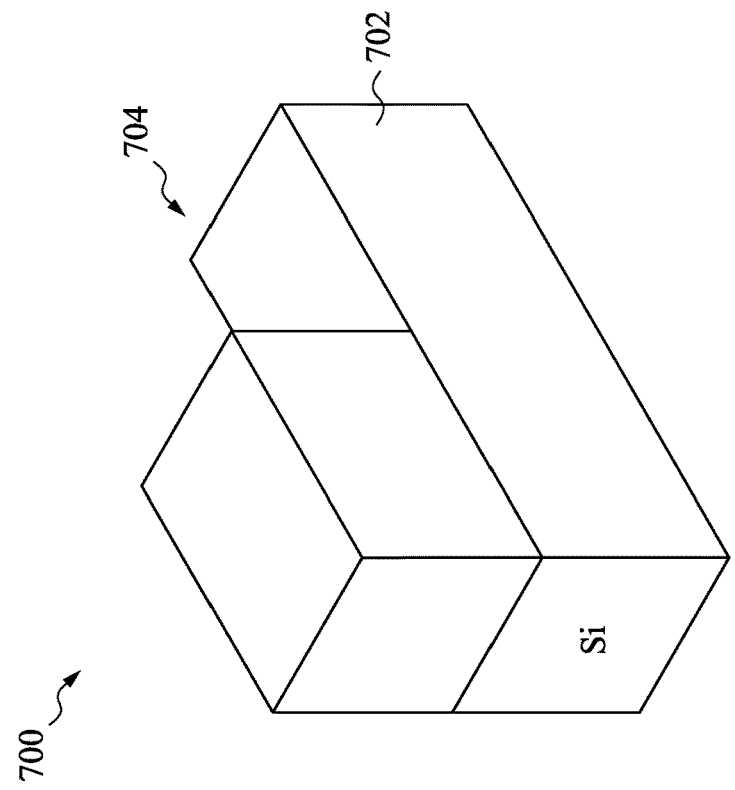
Figure 10:
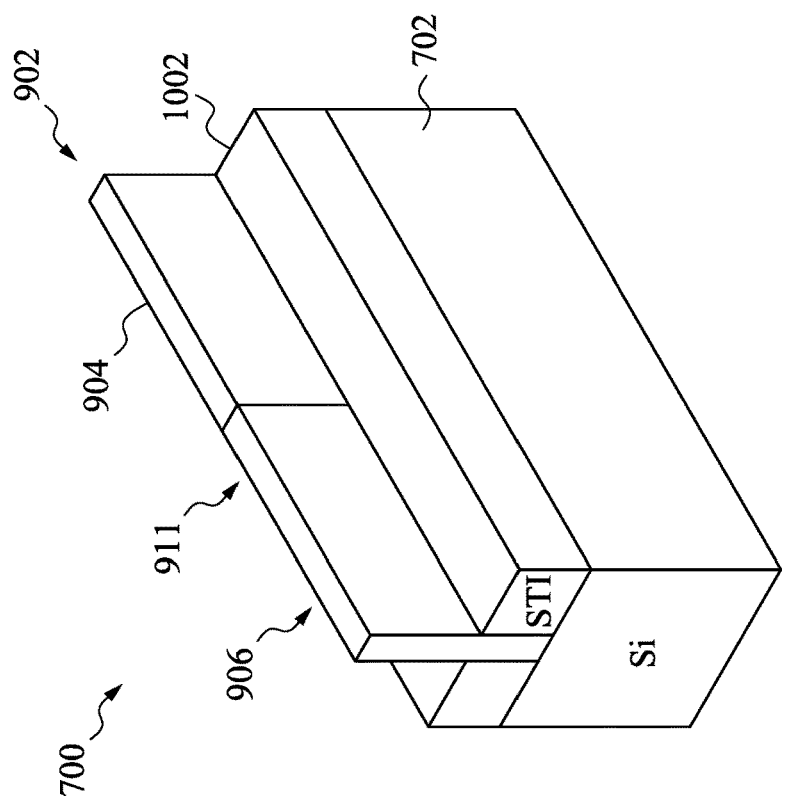

Referring now to FIG. 4, illustrated therein is a layout design 400 of at least a portion of a FinFET standard cell including an anchor, in accordance with some embodiments. As shown, the layout design 400 includes a plurality of active fin regions 402 and a pickup region 404 disposed between the active fin regions 402. A dashed line 406 is used to indicate a P-type active region. Thus, in some embodiments, the plurality of active fin regions 402 may include P-type active fin regions. In some embodiments, regions outside the dashed line 406, such as regions 410, may include N-type active regions. Polysilicon features 408 are also illustrated. Additionally, and in contrast to at least some current designs, the layout design 400 further includes a plurality of anchors 412 disposed between adjacent active fin regions and pickup regions. By providing the anchors 412, embodiments of the present disclosure avoid a gap/discontinuity between the adjacent active fin regions and pickup regions (e.g., such as gap 211 in FIG. 2), which can lead to strain relaxation within the active fin regions.

As discussed above, the embodiments disclosed herein are not meant to be limited to any particular doping configuration, and the examples provided herein are merely provided for purposes of illustration. For example, in some cases, the dashed line 406 may alternatively be used to indicate an N-type active region, and the regions outside the dashed line 406 (e.g., regions 410) may include P-type active regions. The pickup region 404, like the pickup region 204, may include a highly doped region that may be the same conductivity type as the underlying substrate. In the example of FIG. 4, if the region 410 is an N-type active region, then the pickup region 404 may include an N-type pickup region.

Referring to FIG. 5, illustrated therein is an isometric view of a FinFET device 500 including an anchor, in accordance with some embodiments, where the section DD' of FIG. 5 substantially corresponds to the section DD' of FIG. 4. As shown, the FinFET device 500 includes an active fin region 502 (e.g., similar to the plurality of active fin regions 402), a pickup region 504 (e.g., similar to the pickup region 404), an STI region 506, and a substrate 508. In some examples, the substrate 508 may include a substrate fin portion 508A extending from the substrate 508. Further, the FinFET device 500 includes an anchor 511 disposed between and adjacent to each of the active fin region 502 and the pickup region 504. In some embodiments, the anchor 511 may physically connect or contact the active fin region 502 and the pickup region 504. Thus, the anchor 511 prevents the gap/discontinuity between the adjacent active fin regions and pickup regions (e.g., such as gap 311 in FIG. 3), which can lead to strain relaxation within the active fin 502, as discussed herein. Stated another way, the anchor 511 provides for active region continuity, as opposed to discontinuity in the active region for devices including a gap. In various embodiments, the anchor 511, like the active fin region 502 and the pickup region 504, may include epitaxial layers formed over the substrate fin portion 508A, where such epitaxial layers have been deposited, patterned, and etched to form the anchor 511, the active fin region 502 and the pickup region 504. The active fin region 502 may include a P-type active region or an N-type active region, the pickup region 504 may include a P-type pickup region or an N-type pickup region, and the anchor 511 may include an undoped or doped region. In some embodiments, the anchor 511 may be substantially electrically inactive. For purposes of discussion, consider that the active fin region 502 includes a P-type active fin region, the pickup region 504 includes an N-type pickup region, and the anchor 511 includes an undoped or doped epitaxial Si layer. Additionally, consider that the active fin region 502 includes a strained channel material, such as strained SiGe, which may be used to form a strained FinFET channel. In some examples, the substrate 508 (and substrate fin portion 508A) may be formed of Si, thereby providing a lattice mismatch (e.g., strain) between the substrate and the active fin region 502. In some embodiments, formation of the anchor 511 (e.g., a Si anchor) adjacent to and in contact with the active fin region 502, which may include a strained material layer (e.g., a strained SiGe layer), serves to mitigate strain relaxation within the active fin region 502. For example, having continuity at the interface of the active fin region 502/anchor 511, as opposed to the gap/discontinuity (e.g., such as gap 311 in FIG. 3) discussed above, serves to preserve the stress in the active fin region 502. Thus, embodiments of the present disclosure provide for the preservation of enhanced mobility and device performance afforded by the strained channel material within the active fin region. In another aspect, rather than using a gap/discontinuity to alternate (e.g., jog) between an active fin region (e.g., the active fin region 502) and a pickup region (e.g., the pickup region 504), embodiments of the present disclosure employ an anchor to alternate (e.g., jog) between an active fin region and a pickup region while preserving strain in adjacent layers.

Referring now to FIG. 6, illustrated is a method 600 of fabricating a semiconductor device including a FinFET device. The method 600 may be used to implement a fin-based semiconductor device including methods and structures (e.g., anchors) for mitigating strain loss (e.g., in a FinFET channel), so as to prevent mobility reduction and degradation of device performance. In some embodiments, the method 600 may be used to fabricate the device 100 or the device 500, described above with reference to FIG. 1 and FIG. 5, respectively. Thus, one or more aspects discussed above may also apply to the method 600. Additionally, FIGS. 7-10 are isometric views of an exemplary device 700 fabricated according to one or more steps of the method 600 of FIG. 6.

It is understood that parts of the method 600 and/or the semiconductor device 700 may be fabricated by a well-known complementary metal-oxide-semiconductor (CMOS) technology process flow, and thus some processes are only briefly described herein. Further, the semiconductor device 700 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 700 includes a plurality of semiconductor devices (e.g., transistors), which may be interconnected.

The device 700 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 600, the method 600 begins at block 602 where a recess is formed within a substrate. Referring to the example of FIG. 7, in an embodiment of block 602, illustrated is a semiconductor device 700 including a semiconductor substrate 702 having a recess 704 formed therein. The substrate 702 may be substantially similar to the substrate discussed above with reference to FIG. 1. In some embodiments, the recess 704 may be formed by a photolithography and etching process. In some cases, the recess 704 defines a SiGe channel region, as discussed in more detail below.

The method 600 proceeds to block 604 where a SiGe layer is formed within the recess. Referring to the example of FIGS. 7 and 8, in an embodiment of block 604, a SiGe layer 802 is formed within the recess 704. In various embodiments, the SiGe layer 802 may be epitaxially grown within the recess 704. In some embodiments, the SiGe layer 802 may be formed of $Si_{(1-x)}Ge_x$, where 'x' is a percentage of Ge, and where 'x' is greater than 0% and less than 100%. In some embodiments, for example when the semiconductor substrate 702 includes Si, there is a lattice mismatch (e.g., strain) between the semiconductor substrate 702 and the SiGe layer 802. Thus, in some cases, the SiGe layer 802 may be strained.

Figure 9:
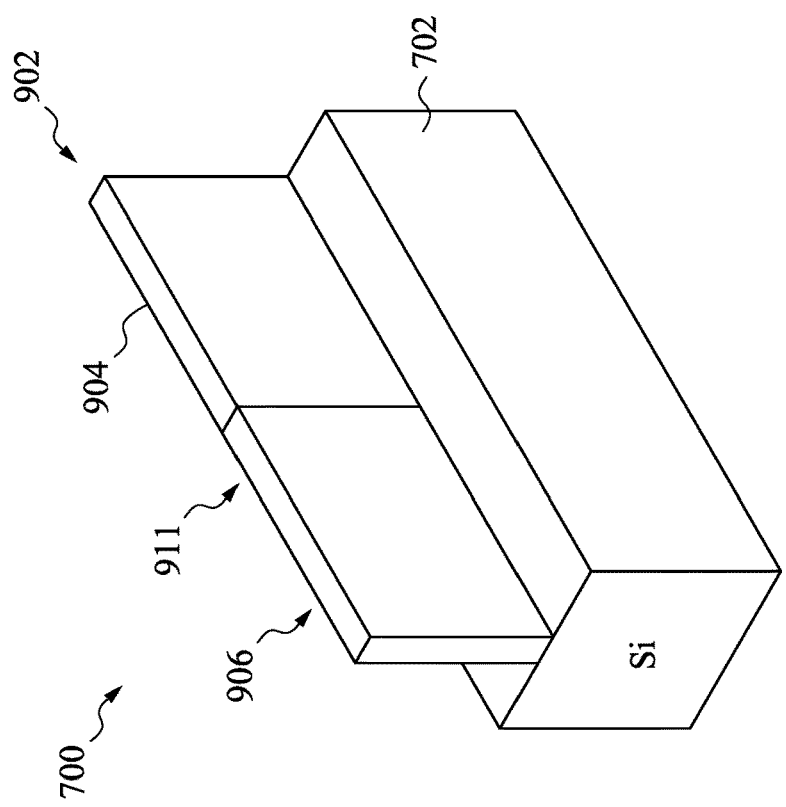

The method 600 proceeds to block 606 where a fin structure is formed. Referring to the example of FIGS. 8 and 9, in an embodiment of block 606, a fin structure 902 is formed. In some embodiments, the fin structure 902 may be formed as described above with respect to FIG. 1. In some aspects, the fin structure 902 may include an active fin region 904, a pickup region 906, and an anchor 911. In some examples, the active fin region 904 may be similar to the active fin region discussed above (e.g., active fin region 502), the pickup region 906 may be similar to the pickup region discussed above (e.g., pickup region 504), and the anchor 911 may be similar to the anchor discussed above (e.g., anchor 511). Additionally, the active fin region 904 is formed from the strained SiGe layer 802. Thus, in some embodiments, the active fin region 904 may include a strained SiGe region which may serve as a FinFET channel. As shown in FIG. 9, the anchor 911 is disposed between and adjacent to each of the active fin region 904 and the pickup region 906. In some embodiments, the anchor 911 may physically connect or contact the active fin region 904 and the pickup region 906. Moreover, as the fin structure 902 is formed from a contiguous material layer (e.g., Si and SiGe), the active fin region 904, the pickup region 906, and the anchor 911 are contiguous with one another. Thus, the anchor 911 prevents strain relaxation (e.g., within the active fin 904), as described above. In some cases, doping of the active fin region 904, the pickup region 906, or the anchor 911, may be performing during or after epitaxial growth of the respective layer or region. In various examples, the active fin region 904 may include a P-type active region or an N-type active region, the pickup region 906 may include a P-type pickup region or an N-type pickup region (e.g., depending on substrate doping type), and the anchor 911 may include an undoped region or a doped (e.g., N-type or P-type) region.

In at least some examples, the active fin region 904 may include a P-type active fin region, the pickup region 906 may include an N-type pickup region, and the anchor 911 may include an undoped or doped epitaxial Si layer. Further, in at least some examples and depending on a material used to fill the recess 704, the active fin region 904 may include a strained channel material, such as strained SiGe, strained Ge, or other strained material, which may be used to form a strained FinFET channel. In general, the active fin region 904 may include a material having a different composition than a composition of the semiconductor substrate 702, in order to induce strain in the active fin region 904. In accordance with embodiments of the present disclosure, formation of the anchor 911 adjacent to and in contact with the active fin region 904 serves to mitigate strain relaxation within the active fin region 904. Thus, embodiments of the present disclosure provide for the preservation of enhanced mobility and device performance afforded by the strained channel material within the active fin region.

The method 600 proceeds to block 608 where an STI region is formed. Referring to the example of FIGS. 9 and 10, in an embodiment of block 608, an STI region 1002 is formed. In some cases, the STI region 1002 includes a recessed STI region. Additionally, in some embodiments, the recessed STI region 1002 may be substantially the same as described above. Further, after block 608, the device 700 may be substantially the same as the device 500, as illustrated in FIG. 5.

The semiconductor device 700 may undergo further processing to form various features and regions known in the art. For example, subsequent processing may form a gate stack, sidewall spacers, source/drain regions, various contacts/vias/lines and multilayers interconnect features (e.g., metal layers and interlayer dielectrics) on the substrate 702, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 600, and some process steps described above may be replaced or eliminated in accordance with various embodiments of the method 600.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods and structures for mitigating strain loss (e.g., in a FinFET channel), so as to prevent mobility reduction and degradation of device performance. In some embodiments, an anchor, formed between an active fin region and a pickup region, is used to mitigate strain relaxation in the active fin region by physically connecting or contacting the active fin region and the pickup region and thus avoiding a gap and/or discontinuity between these adjacent epitaxial layers. In various embodiments, formation of the anchor adjacent to and in contact with the active fin region, which may include a strained material layer, serves to mitigate strain relaxation within the active fin region. By way of example, in some embodiments, the anchor may include a Si anchor formed adjacent to the active fin region, where the active fin region includes a strained SiGe layer. Thus, embodiments of the present disclosure provide for the preservation of enhanced mobility and device performance afforded by the strained channel material (e.g., the strained SiGe layer) within the active fin region.

Thus, one of the embodiments of the present disclosure described semiconductor device including a substrate having a substrate fin portion, an active fin region formed over a first part of the substrate fin portion, a pickup region formed over a second part of the substrate fin portion, and an anchor formed over a third part of the substrate fin portion. In some embodiments, the substrate fin portion includes a first material, and the active fin region includes a second material different than the first material. In various examples, the anchor is disposed between and adjacent to each of the active fin region and the pickup region.

In another of the embodiments, discussed is semiconductor device including a substrate having a recessed fin. The substrate is composed of a first material. The semiconductor device further includes a P-type active fin region disposed over the recessed fin, where the P-type active fin region is composed of a second material different than the first material. The semiconductor device further includes an N-type pickup region disposed over the recessed fin and adjacent to the P-type active fin region, where the N-type pickup region and the P-type active fin region are separated by a gap. In addition, the semiconductor device includes a silicon (Si) anchor disposed over the recessed fin within the gap, where the Si anchor is adjacent to and in contact with each of the P-type active fin region and the N-type pickup region.

In yet another of the embodiments, discussed is a method comprising forming a recess within a substrate, where the substrate includes a first material. In some embodiments, a channel layer is grown within the recess, where the channel layer includes a second material different than the first material. In various examples, the channel layer and an adjacent portion of the substrate are patterned to form a contiguous fin structure that includes a first region, a second region, and an anchor disposed between the first region and the second region. In some embodiments, the first region includes the patterned channel layer, and the second region and the anchor include the patterned adjacent portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a substrate fin portion, wherein the substrate fin portion includes a first material;
   a first region formed over a first part of the substrate fin portion, wherein the first region includes a second material different than the first material;
   a second region formed over a second part of the substrate fin portion; and
   an anchor formed over a third part of the substrate fin portion, wherein the anchor is disposed between and adjacent to each of the first region and the second region.

2. The semiconductor device of claim 1, wherein the anchor physically contacts each of the first region and the second region.

3. The semiconductor device of claim 1, wherein the first region includes a P-type active region and the second region includes an N-type second region.

4. The semiconductor device of claim 1, wherein each of the first region, the second region, and the anchor include epitaxially grown layers.

5. The semiconductor device of claim 1, wherein the first region includes a strained SiGe layer, and wherein the anchor includes a silicon (Si) layer.

6. The semiconductor device of claim 5, wherein the anchor prevents strain relaxation within the strained SiGe layer.

7. The semiconductor device of claim 1, wherein the first material includes silicon (Si) and the second material includes SiGe.

8. The semiconductor device of claim 5, wherein the anchor includes an undoped Si layer.

9. The semiconductor device of claim 1, wherein the anchor is circuit inoperable.

10. The semiconductor device of claim 1, wherein the second region is the same conductivity type as the substrate fin portion.

11. A semiconductor device, comprising:
    a substrate including a recessed fin, wherein the substrate is composed of a first material;
    a P-type first region disposed over the recessed fin, wherein the P-type first region is composed of a second material different than the first material;
    an N-type second region disposed over the recessed fin and adjacent to the P-type first region, wherein the N-type second region and the P-type first region are separated by a gap; and
    a silicon (Si) anchor disposed over the recessed fin within the gap, wherein the Si anchor is adjacent to and in contact with each of the P-type first region and the N-type second region.

12. The semiconductor device of claim 11, wherein each of the P-type first region, the N-type second region, and the Si anchor include epitaxial layers.

13. The semiconductor device of claim 11, wherein the P-type first region includes one of a strained SiGe layer and a strained Ge layer.

14. The semiconductor device of claim 11, wherein the Si anchor mitigates strain relaxation within the P-type first region.

15. The semiconductor device of claim 11, wherein the first material includes silicon (Si) and the second material includes SiGe.

16. The semiconductor device of claim 11, wherein the N-type second region provides a low resistance contact to the substrate.

17. A semiconductor device, comprising:
    a substrate having a continuous fin extending therefrom, wherein the substrate includes a first dopant type, and wherein the continuous fin includes:
    an active region including a first layer disposed over the substrate, wherein a lattice mismatch between the first layer and the substrate provides strain in the first layer, and wherein the strained layer includes a channel region;

a pickup region including a second layer disposed over the substrate, wherein the second layer includes the first dopant type, and wherein the pickup region is in contact with the substrate; and an anchor including a third layer disposed over the substrate, wherein the third layer is further disposed between and in contact with each of the first layer and the second layer to provide the continuous fin, wherein the anchor prevents relaxation of the strained layer.

18. The semiconductor device of claim 17, wherein the substrate and the third layer include Si.

19. The semiconductor device of claim 18, wherein the first layer includes SiGe.

20. The semiconductor device of claim 17, wherein the first layer includes a second dopant type different than the first dopant type.

* * * * *